United States Patent [19]
Hoelzle

[11] Patent Number: 5,321,368
[45] Date of Patent: Jun. 14, 1994

[54] SYNCHRONIZED, DIGITAL SEQUENTIAL CIRCUIT

[75] Inventor: Josef Hoelzle, Bad Woerishofen, Fed. Rep. of Germany

[73] Assignee: Siemens Aktiengesellschaft, Munich, Fed. Rep. of Germany

[21] Appl. No.: 24,644

[22] Filed: Mar. 1, 1993

[30] Foreign Application Priority Data

Feb. 27, 1992 [DE] Fed. Rep. of Germany ....... 4206082

[51] Int. Cl.⁵ .............................................. H04L 7/00
[52] U.S. Cl. ..................... 328/63; 307/269; 328/72; 328/75
[58] Field of Search .............. 307/272.1, 272.2, 269, 307/542.1; 328/63, 72, 73, 74, 75; 377/49, 54, 77, 78, 80

[56] References Cited

U.S. PATENT DOCUMENTS

| 4,607,172 | 8/1986 | Frederiksen et al. | 307/291 |
| 4,748,417 | 5/1988 | Spengler | 328/72 |
| 4,771,441 | 9/1988 | Spengler et al. | 307/269 |
| 4,873,456 | 10/1989 | Olisar et al. | 307/272.1 |

FOREIGN PATENT DOCUMENTS 0168231 1/1986 European Pat. Off. .

OTHER PUBLICATIONS

German Publication "Halbleiter-Schaltungstechnik", Tietze et al. (1983) p. 234 6th Edition.
German Publication "Halbleiter-Schaltungstechnik", Tietze et al. (1985) pp. 259-261 7th Edition.
Electronic Circuits, Tietze et al, pp. 211, 212, 234-236 (1991).

Primary Examiner—John Zazworsky
Assistant Examiner—Shawn Riley
Attorney, Agent, or Firm—Herbert L. Lerner; Laurence A. Greenberg

[57] ABSTRACT

A synchronized, digital sequential circuit includes state-controlled memory elements, each having a clock input, at least two outputs being complementary to one another and at least two inputs, which are connected to a logical OR linkage or wired OR connection. At least two state-controlled memory elements are connected in series. A first memory element performs the OR linkage or operation and a second memory element performs the AND linkage or operation of a combinatorial logic function. The settling time of a memory element and the delay time for forming the OR and AND linkages or operations coincide. Therefore, a high speed of operation is possible in the sequential circuit.

16 Claims, 2 Drawing Sheets

SYNCHRONIZED, DIGITAL SEQUENTIAL CIRCUIT

The invention relates to a synchronized, digital sequential circuit for performing a logical function with memory elements and circuit means that execute an OR linkage or operation.

Sequential circuits are digital, synchronously clocked systems in which the system state is stored in memory elements. Output signals are calculated from input signals and from the stored signals, by means of combinatorial logic. Such sequential circuits are known, for instance, from the book by Tietze and Schenk, entitled "Halbleiterschaltungs-technik" [Semiconductor Circuitry], 7th Edition, pp. 259–261. Edge-controlled memory elements are used as the memory elements therein. In edge-controlled memory elements, the data must typically be present for at least a predetermined period of time prior to the clock edge at the data inputs of the memory element. That period of time is called the settling time. The data are stored in memory elements at the clock pulse. A certain period of time then elapses until the data appear at the output. That time is called the delay time of the memory element. Accordingly, one clock period minus the delay time and the settling time of the memory elements is available for the calculation by the combinatorial logic between two successive clock edges. The maximum processing speed of the sequential circuit is attained once the sum of the delay time and the settling time of the memory element and the delay time of the combinatorial logic equals the length of one clock period.

It is accordingly an object of the invention to provide a synchronized, digital sequential circuit, which overcomes the hereinafore-mentioned disadvantages of the heretofore-known devices of this general type and with which a higher processing speed is possible.

With the foregoing and other objects in view there is provided, in accordance with the invention, a synchronized, digital sequential circuit, comprising at least one first and one second state-controlled memory element, each having one clock input, at least two outputs complementary to one another and at least two inputs, which are connected to a logical OR linkage or wired OR connection; the memory elements are connected in series, in such a way that one of the outputs of the first memory element is connected to one of the inputs of the second memory element; one of the outputs of the last of the series-connected memory elements is fed back to a first part of the inputs of the first memory element; a second part of the inputs of the first memory element is connected to inputs of the sequential circuit, and one of the outputs of the second memory element serves as the output of the sequential circuit; and the clock inputs of two series-connected memory elements are each controlled by one clock signal, and the clock signals are phase-shifted from one another by a phase of one clock period, divided by the number of memory elements.

With the objects of the invention in view, there is also provided a synchronized, digital sequential circuit, comprising a plurality of state-controlled memory elements, each having one clock input, at least two outputs being complementary to one another and at least two inputs which are connected to a logical OR linkage or wired OR connection, and the memory elements are divided into at least one first and one second group; the memory elements of the first and second group are connected in series, in such a way that one of the outputs of the memory elements of the first group is connected to one of the inputs of the memory elements of the second group; one of the outputs of the memory elements of the last of the series-connected groups is fed back to a first part of the inputs of the memory elements of the first group; a second part of the inputs of the memory elements of the first group is connected to inputs of the sequential circuit, and one of the outputs of the memory elements of the second group act as the outputs of the sequential circuit; and the clock inputs of the memory elements of each group are each controlled by a single clock signal, and the clock signals of two series-connected groups are phase-shifted from one another by a phase of one clock period, divided by the number of groups.

Other features which are considered as characteristic for the invention are set forth in the appended claims.

Although the invention is illustrated and described herein as embodied in a synchronized, digital sequential circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 6:
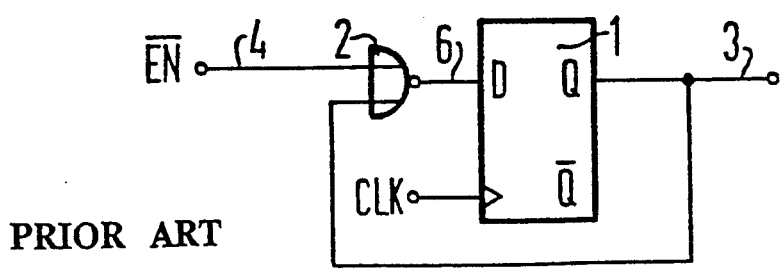
FIG. 6 is a diagram of a sequential circuit of the prior art.

Referring now to the figures of the drawing in detail and first, particularly, to FIG. 6 thereof, there is seen a sequential circuit of the prior art. The circuit of FIG. 6 is a divisor by two that is provided with an enable input and includes a clock-edge-controlled memory element. The clock-edge-controlled memory element is a D-flip-flop 1. An output 3 of the D-flip-flop 1 is fed back to its input. An L--active enable signal $\overline{EN}$ is connected to the feedback over a line 4 and through a NOR circuit or gate 2. If the enable input is at L potential, then the negated value of the output signal of the D-flip-flop is established at the output of the NOR circuit or gate 2. Upon the next negative clock edge, this logical value is stored in memory in the D-flip-flop 1. At the output 3, an alternating succession of L and H accordingly appears, with a frequency that is half the frequency of a clock signal CLK. If the enable signal $\overline{EN}$ is H, then the output of the NOR circuit or gate 2 is always L, and therefore the output 3 remains at L.

In a clock-edge-controlled memory element such as the D flip-flop 1, valid data signals as a rule must be present at an input 6 for a certain period of time, which is the so-called settling time, before the clock edge. The data signals must not vary further during the settling time. After the clock edge, it takes the so-called delay time of the memory element until the signal present at the data input appears in valid form at the output 3. The period of time between two successive clock edges, in other words one clock period, minus the setting and delay times, is the maximum time available for the delay time of the NOR circuit or gate 2. The highest processing speed of the sequential circuit of FIG. 6 is accordingly limited by the sum of the setting and delay times of the D-flip-flop 1 and the delay time of the circuit 2.

Figure 1:
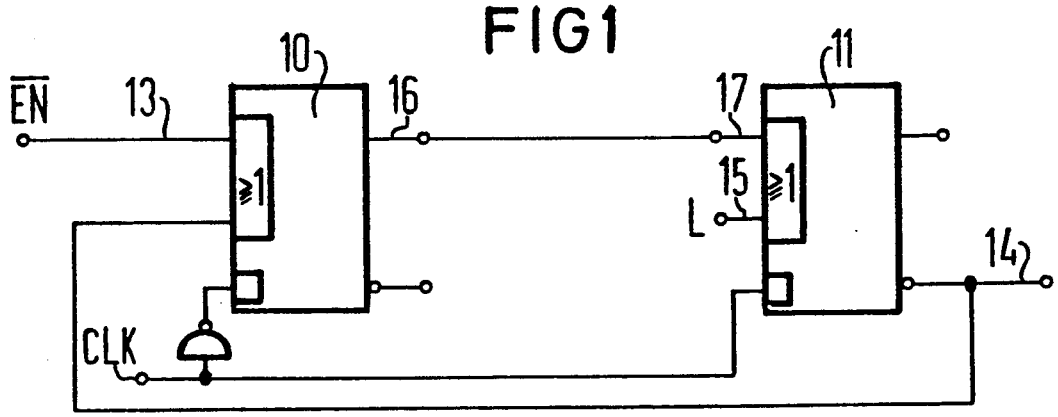
FIG. 1 is a schematic and block circuit diagram of an embodiment of a sequential circuit according to the invention.

FIG. 1 shows an embodiment of a sequential circuit according to the invention, which performs the same function as the sequential circuit shown in FIG. 6. Two state-controlled memory elements 10, 11 are connected in series, in such a way that an output 16 of the memory element 10 is connected to one input 17 of the memory element 11. Another input 15 of the memory element 11 is connected to an L potential. negated output 14 of the second or last memory element 11 serves as the output of the sequential circuit and is fed back to one input or to a first part of the inputs of the first memory element 10. Another input or a second part of the inputs 13 of the first memory element 10 is controlled by the enable signal $\overline{EN}$. The clock signal CLK is present at a clock input of the memory element 11, while the memory element 10 is controlled by the negated clock signal, that is by the clock signal shifted by one-half of a clock period.

Each of the clock-state controlled memory elements 10, 11 is provided as a memory element that has a first output and a second output complementary thereto. It also has two inputs, which are connected to a logical OR linkage or wired OR connection. The outcome of this OR linkage is stored in memory in the memory element. During the H phase of the clock signal, the memory element is transparent. This means that the outcome of the OR linkage or operation is present at the outputs of the memory element, and any variations in the outcome become immediately effective at the outputs as well. During the L phase of the clock signal, the outcome that had been stored in memory immediately before the clock edge is stored in memory. Calculating the OR linkage or operation or wired OR connection takes a certain period of time. If the data at the inputs to the memory element do not change during this period of time, then immediately after the clock edge, the valid outcome is present at the outputs of the memory element. Accordingly, in this kind of clock-state-controlled, transparent memory element, there is no delay time after the storing process.

Figure 2:
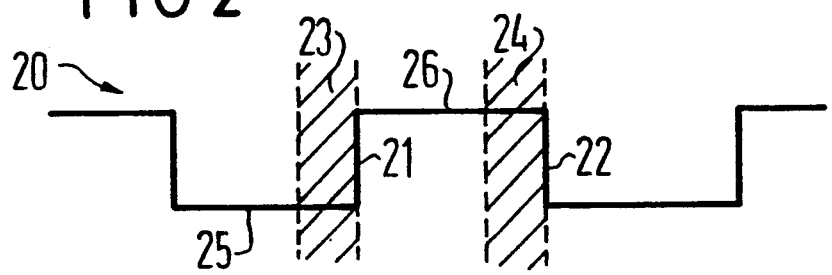
FIG. 2 is a clock signal diagram for the circuit of FIG. 1.

FIG. 2 provides a clock signal diagram to explain the function of the sequential circuit of FIG. 1. During an L phase 25 of a clock signal 20, the memory element 10 is transparent. At an instant that a clock edge 21 appears, the outcome of the OR linkage or operation of the signals $\overline{EN}$ and the fed-back signal of the output 14 is stored in memory. A time period 23 is the settling time of the memory element 10. During an H phase 26 of the clock signal 20, the memory element 11 is transparent, and at the appearance of a clock edge 22, it stores the OR linkage or operation of the signals at its inputs 17 and 15. Accordingly, for each negative clock edge, one valid signal is present at the output 14. The length of one clock period must be at least two settling times 23, 24 of a clock-state-controlled memory element. As compared with the sequential circuit of FIG. 6, the delay time for the circuit 2 and the delay time of the clock-edge-controlled D-flip-flop 1 are eliminated. If approximately equal-length settling times for clock-state-controlled and clock-edge-controlled memory elements are assumed, then in a sequential circuit constructed according to the invention, the speed can be selected to be substantially higher than for an embodiment according to the prior art.

In the logical function to be performed, the task of data storage is carried out by the two series-connected clock-state-controlled memory elements 10, 11. All of the OR linkage or operation or wired OR connections are calculated during the L phase 25 of the clock signal, and all of the AND linkages or operations of the combinatorial logic to be achieved are calculated during the H phase 26. The present combinatorial logic includes a NOR linkage or wired NOR connection. Without affecting its outcome, it is expanded by an AND linkage or wired AND connection on its output side, having a logical H level. The NOR linkage or operation is calculated in the memory element 10 and the AND linkage or operation with the logical H level is calculated in the memory element 11. Since the AND linkage or operation is carried out in the memory element 11 by means of an OR circuit or gate, the input signals and the output signals are negated. Accordingly, the input 17 of the memory element 11 is connected to the positive output of the memory element 10, while the other input 15 of the memory element 11 is connected to an L level, and the output of the sequential circuit is connected to the negative output of the memory element 11.

Figure 3:
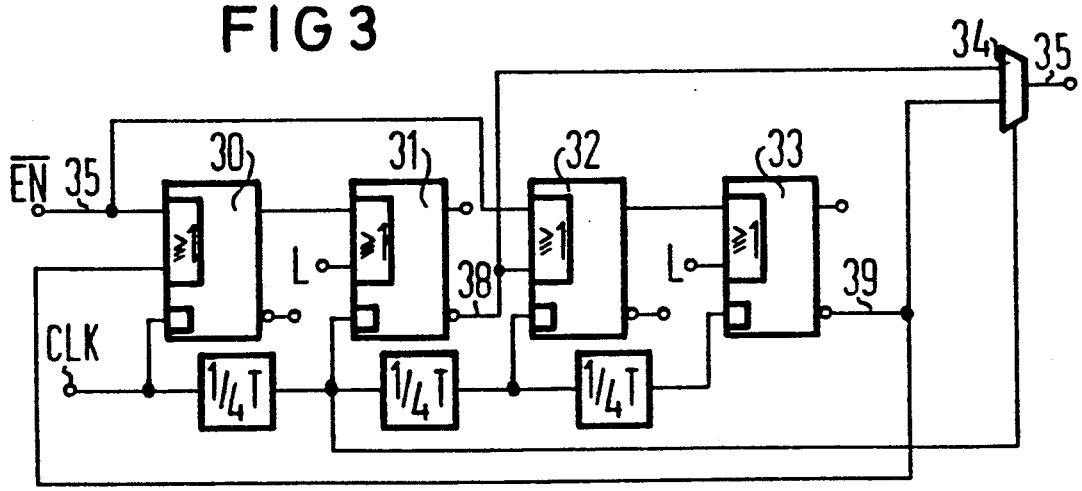
FIG. 3 is a view similar to FIG. 1 of an embodiment of a sequential circuit with four memory elements.

A further option for constructing the present sequential circuit is shown in FIG. 3. In this case, four state-controlled memory elements 30, 31, 32, 33 are connected in series. The configuration of the first and second memory elements 30, 31 is equivalent to the circuit shown in FIG. 1.

They are followed by a corresponding configuration having the third and fourth memory elements 32, 33. The input signal which is provided at a second part of the inputs of the memory element 32 is the input signal $\overline{EN}$ and the input signal which is provided at a first part of the inputs of the memory element 32 is the output signal of the memory element 31. The output signals of the sequential circuit are present at outputs 38, 39 of the memory elements 31 and 33, respectively. The clock signals of series-connected memory elements are each shifted by one-quarter of a clock period.

If the clock signal CLK changes from an H level to an L level at a first clock edge, then in the memory element 30 the outcome of the OR linkage or operation of a first value of the input signal $\overline{EN}$ and the signal at the output 39 at the last of the series-connected memory elements is calculated. The outcome of the AND linkage or operation is present at the output 38 of the memory element 31 one-quarter of a clock period later. In order to calculate the logical function for the first value of the input signal $\overline{EN}$, one-half of a clock period is accordingly required. A second value of the input signal $\overline{EN}$, chronologically following the first value, is linked in the memory element 32 with the outcome of the first calculation at the output 38. One-half of a clock period later, the outcome of the logical function for the second value is present at the output 39 of the memory element 33. Accordingly, one period of the clock signal is necessary to calculate two chronologically succeeding values of the input signal $\overline{EN}$. The sequential circuit of FIG. 2 has the advantage that the frequency of the clock signal CLK is equal to the frequency of the input signal $\overline{EN}$. The output signals at the outputs 38, 39 of the respective memory elements 31 and 33 are carried through a multiplexer 34 to a further output 35 of the sequential circuit. The multiplexer 34 is controlled by the clock signal of the memory element 31 in such a way that one of the output signals at each of the outputs 38, 39 appears at the output 39 during the half of the clock period that follows the associated first or second value of the input signal $\overline{EN}$.

Figure 4:
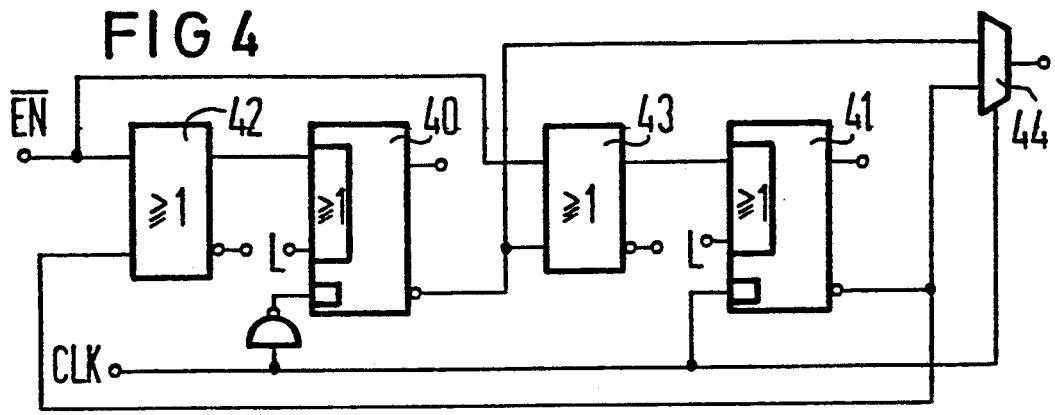
FIG. 4 is a view similar to FIGS. 1 and 3 of an embodiment of a sequential circuit with two memory elements and with OR circuits or gates connected to the input sides thereof.

FIG. 4 shows an embodiment according to the invention with the sequential circuit known from FIG. 6, with two state-controlled memory elements and with OR circuits or gates preceding the memory elements. One of the first and second OR circuits or gates 42, 43 precedes each respective one of the first and second memory elements 40, 41. In other words, the positive output of each of the OR circuits or gates is connected to one of the inputs of a respective one of the memory elements. The OR circuits or gates have at least two inputs and an output that is complementary to the positive output. A first part of the inputs of the OR circuits or gates 42, 43 is controlled by the enable signal $\overline{EN}$, while a second part of the inputs thereof is connected to the negated output of the memory element 41 or 40. The memory elements 40, 41 are controlled by clock signals being phase-shifted by half of one clock period. A multiplexer 44 which is controlled by the clock signal CLK is connected downstream of the negated outputs of the switch elements 40, 41. The circuit of FIG. 4 corresponds to the circuit of FIG. 3, except that instead of the memory elements 30, 32 present there, it has the OR circuits or gates 42, 43. This means that the storing function of the memory elements 30, 32 is eliminated and the function of the OR linkage or wired OR connections of the circuit elements 30, 32 is performed by the OR circuits or gates 42, 43. The circuit of FIG. 4 has the advantage over the circuit of FIG. 3 of economizing on components. The latter has the advantage of always using the same kind of components, so that a regular structure is therefore possible.

The exemplary embodiments of FIGS. 1, 3 and 4 described thus far show various options for constructing the same logical circuit. If a different logical function is achieved, in which more than one logical value is stored in memory, then in an embodiment according to the invention, a group having more than one memory element, instead of only each single one of the memory elements 10, 11 or 30, 31, 32, 33 or 40, 41, is provided. All of the memory elements of one group are controlled by the same clock signal. In the case of the embodiment of FIG. 4, groups of OR circuits or gates are also provided, which correspond to the OR circuits or gates 42, 43. Each of these groups is connected in a manner corresponding to the single memory element and OR circuits or gates shown in the exemplary embodiments. The specific connection of all of the inputs and outputs of each of the memory elements and OR circuits or gates depends on the particular logical function to be achieved.

Figure 5:
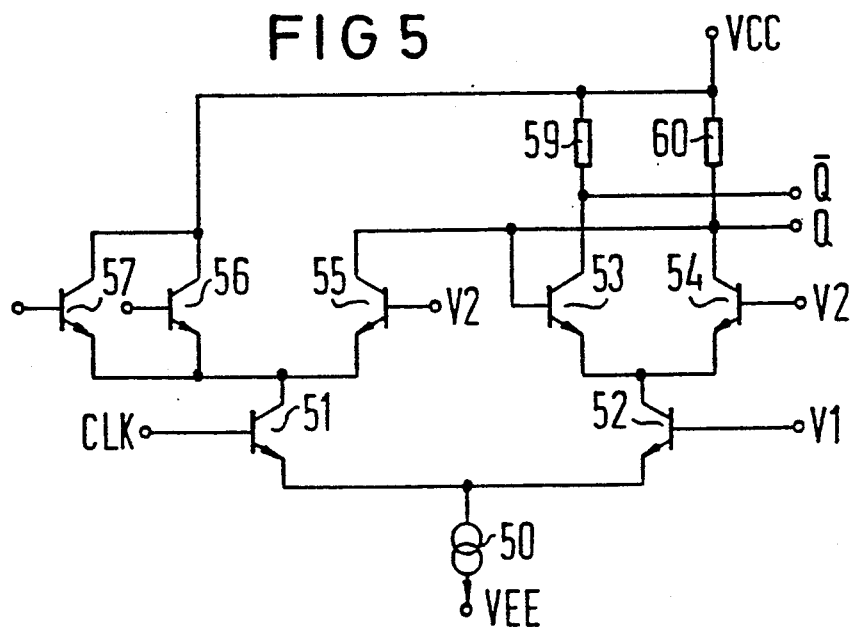
FIG. 5 is a schematic circuit diagram of an embodiment of a state-controlled memory element in current circuit technology.

One embodiment of a transparent, clock-state-controlled memory element is shown in FIG. 5. The present circuit is made by bipolar current circuit technology. A current switch includes two emitter-coupled bipolar transistors 51, 52, having emitters which are connected through a current source 50 to a supply potential VEE. The collectors of these transistors are each connected to the emitters of a respective further pair of transistors 56, 55 and 53, 54. The collectors of the transistors 53, 54 are each connected through a respective resistor 59 or 60 to a further supply potential VCC. The collectors of the transistors 55, 54 are coupled and form an output Q. The collector of the transistor 53 serves as an output $\overline{Q}$ which is complementary thereto. The base terminal of the transistor 52 is connected to a first reference potential V1, and the base terminals of the transistors 55, 54 are connected to a second reference potential V2. The clock signal CLK is applied to the base of the transistor 51. The collector-to-emitter path of a further bipolar transistor 57 is connected parallel to the collector-to-emitter path of the transistor 56. The base of the transistor 56 is controlled by an input signal and the base of the transistor 57 is controlled by a further input signal. The output signal Q is fed back to the base of the transistor 53. The inputs of the transistors 56, 57 are connected to an OR linkage or wired OR connection. The OR linkage is created on the basis of the parallel-connected collector-to-emitter paths of these transistors, but without causing any additional signal transit time. In principle, it is possible to connect further input transistors parallel to the transistors 56, 57, in order to form a memory element having more than two input signals.

The circuit functions as follows: The clock signal CLK is assumed to be H. The current of the current source 50 accordingly flows through the transistor 51 while the transistor 52 is blocked. If at least one of the transistors 56, 57 is controlled by an H level, then a current flows through that transistor, and the transistor 55 is blocked. The output Q is then at H potential, because no current is flowing through the resistor 60. The OR linkage or operation of the input signals is thus established at the output Q. If the outcome of the OR linkage or operation changes, for instance because all of the input transistors are blocked, then the current flows through the transistor 55 and brings about an L level at the output Q. This takes place immediately after the change in the input signals. In other words, the flip-flop is transparent. If the clock signal changes to an L level, the current flows through the transistor 52. Due to the feedback of the output Q to the base of the transistor 53, the level prevailing at just that time is stored in memory at the output Q. The output $\overline{Q}$ behaves inversely to the output Q. If the input levels at the transistors 56, 57 then change, this does not affect the outputs Q, $\overline{Q}$, because the transistor 51 is without current.

If the clock signal CLK is H, and accordingly the current flows through the transistor 51, then a first delay time ensues between level changes at the inputs of the transistors 56 57 and the reaction to this at the outputs Q, $\overline{Q}$, because of parasitic collector-to-substrate capacitances. Similarly, there is a second delay time for the switchover of the current from the transistor 51 to the transistor 52 upon a negative clock edge. If the stored level at the outputs Q, $\overline{Q}$ is to be valid at the instant of the negative clock edge, then the input signals must not be changed within the first and second delay times before the entry of the clock edge. The settling time of the memory element, or in other words the period of time before the clock edge during which the data must no longer be changed, is accordingly defined by the longer of these two delay times. The memory element has the advantage of having the delay time for calculating the combinatorial logic and the settling time of the memory element coincide.

I claim:

1. A synchronized, digital sequential circuit, comprising:
   a) series-connected clock-state-controlled memory elements including at least one first memory element and one second memory element, one of said memory elements being a last memory element, each of said memory elements having one clock input, at least two outputs being complementary to one another and at least two inputs, one of the outputs of said first memory element being connected to one of the inputs of said second memory element;
   b) the inputs of said first memory element including a first part to which one of the outputs of said last memory element is fed back;
   c) the inputs of said first memory element including a second part connected to inputs of the sequential circuit, and one of the outputs of said second memory element serving as an output of the sequential circuit;
   d) the clock inputs of said memory elements being controlled by clock signals being phase-shifted relative to one another;
   e) each of said memory elements having a clock-state-controlled D-flip-flop with an input and complementary outputs and an OR gate with inputs and an output;
   f) for each of said memory elements the output of said OR gate being connected to the input of said D-flip-flop, the inputs of said memory elements being the inputs of said OR gate, and the complementary outputs of said memory element being the complementary outputs of said D-flip-flop; and
   g) the clock signals of two of said series-connected memory elements each being phase-shifted relative to one another by a phase of one clock period, divided by the number of said memory elements.

2. The sequential circuit according to claim 1, wherein:
   a) said memory elements include third and fourth memory elements each having one clock input, at least two outputs being complementary to one another and at least two inputs;
   b) the inputs of said third memory element include a first part connected to one of the outputs of said second memory element, and one of the outputs of said third memory element is connected to one of the inputs of said fourth memory element; and
   c) the inputs of said third memory element include a second part being connected to the inputs of the sequential circuit, and one of the outputs of said fourth memory element serves as a further output of the sequential circuit.

3. The sequential circuit according to claim 1, including OR gates each having at least two inputs and at least two outputs being complementary to one another, each of said OR gates being connected upstream of a respective one of said first and second memory elements; and wherein:
   a) the inputs of said OR gates include a first part connected to the inputs of the sequential circuit;
   b) the inputs of said OR gate connected upstream of said first memory element include a second part connected to one of the outputs of said second memory element, and the inputs of said OR gate connected upstream of said second memory element include a second part connected to one of the outputs of said first memory element;
   c) one of the outputs of said OR gate connected upstream of said first memory element is connected to one of the inputs of said first memory element, and one of the outputs of said OR gate connected upstream of said second memory element is connected to one of the inputs of said second memory element; and
   d) one of the outputs of said second memory element serves as a further output of the sequential circuit.

4. The sequential circuit according to claim 2, including a multiplexer being controlled by one of the clock signals present at the clock inputs of said memory elements, said multiplexer having inputs connected to the output and the further output of the sequential circuit.

5. The sequential circuit according to claim 3, including a multiplexer being controlled by one of the clock signals present at the clock inputs of said memory elements, said multiplexer having inputs connected to the output and the further output of the sequential circuit.

6. A synchronized, digital sequential circuit comprising:
   a) series-connected groups each having at least one clockstate-controlled memory element, said groups including at least one first group and one second group, one of said groups being a last group, each of said memory elements having one clock input, at least two outputs being complementary to one another and at least two inputs, one of the outputs of said at least one memory element of said first group being connected to one of the inputs of said at least one memory element of said second group;
   b) the inputs of said at least one memory element of said first group having a first part to which one of the outputs of said at least one memory element of said last group is fed back;
   c) the inputs of said at least one memory element of said first group having a second part connected to inputs of the sequential circuit, and one of the outputs of said at least one memory element of said second group serving as an output of the sequential circuit;
   d) the clock input of said at least one memory element of each of said groups being controlled by clock signals being phase-shifted relative to one another;
   e) each of said memory elements includes a clock-state-controlled D-flip-flop having an input and complementary outputs and an OR gate having inputs and an output;
   f) for each of said memory elements the output of said OR gate is connected to the input of said D-flip-flop, the inputs of said memory element are the inputs of said OR gate, and the complementary outputs of said memory element are the complementary outputs of said D-flip-flop; and
   g) the clock signals of two of said series-connected groups of memory elements each are phase-shifted relative to one another by a phase of one clock period, divided by the number of said groups.

7. The sequential circuit according to claim 6, including:
   a) third and fourth groups each having at least one memory element, each of said memory elements of said third and fourth groups having one clock input, at least two outputs being complementary to one another and at least two inputs;
   b) the inputs of said at least one memory element of said third group having a first part being connected to the output of said at least one memory element of said second group, one of the outputs of said at least one memory element of said third group being connected to one of the inputs of said at least one memory element of said fourth group; and c) the inputs of said at least one memory element of said third group having a second part being connected to the inputs of the sequential circuit, and one of the outputs of said at least one memory element of said fourth group serving as further outputs of the sequential circuit.

8. The sequential circuit according to claim 6, including OR gates each having at least two inputs and at least two outputs being complementary to one another, each of said OR gates being connected upstream of a respective one of said at least one memory element of each of said first and second groups; and wherein:

a) the inputs of said OR gates include a first part connected to the inputs of the sequential circuit;
b) the inputs of said OR gate connected upstream of said at least one memory element of said first group include a second part connected to one of the outputs of said at least one memory element of said second group, and the inputs of said OR gate connected upstream of said at least one memory element of said second group include a second part connected to one of the outputs of said at least one memory element of the first group;
c) one of the outputs of said OR gate connected upstream of said at least one memory element of said first group is connected to one of the inputs of said at least one memory element of said first group, and one of the outputs of said OR gate connected upstream of said at least one memory element of said second group is connected to one of the inputs of said at least one memory element of said second group; and
d) one of the outputs of said at least one memory element of said second group serves as a further output of the sequential circuit.

9. The sequential circuit according to claim 7, including a multiplexer being controlled by one of the clock signals at the clock inputs of said memory elements, said multiplexer having inputs connected in pairs to the outputs and the further outputs of the sequential circuit.

10. The sequential circuit according to claim 8, including a multiplexer being controlled by one of the clock signals at the clock inputs of said memory elements, said multiplexer having inputs connected in pairs to the outputs and the further outputs of the sequential circuit.

11. The sequential circuit according to claim 1, wherein said memory elements are constructed in bipolar current circuit technology and have input transistors with collector-to-emitter paths being connected in parallel.

12. The sequential circuit according to claim 2, wherein said memory elements are constructed in bipolar current circuit technology and have input transistors with collector-to-emitter paths being connected in parallel.

13. The sequential circuit according to claim 3, wherein said memory elements are constructed in bipolar current circuit technology and have input transistors with collector-to-emitter paths being connected in parallel.

14. The sequential circuit according to claim 6, wherein said memory elements are constructed in bipolar current circuit technology and have input transistors with collector-to-emitter paths being connected in parallel.

15. The sequential circuit according to claim 7, wherein said memory elements are constructed in bipolar current circuit technology and have input transistors with collector-to-emitter paths being connected in parallel.

16. The sequential circuit according to claim 8, wherein said memory elements are constructed in bipolar current circuit technology and have input transistors with collector-to-emitter paths being connected in parallel.

* * * * *